United States Patent [19]

Yonehara et al.

[11] Patent Number: 5,453,394
[45] Date of Patent: Sep. 26, 1995

[54] PROCESS FOR PREPARING SEMICONDUCTOR SUBSTRATE BY BRINGING FIRST AND SECOND SUBSTRATES IN CONTACT

[75] Inventors: Takao Yonehara, Atsugi; Kenji Yamagata, Kawasaki, both of Japan

[73] Assignee: Canon Kabushiki Kaisha, Tokyo, Japan

[21] Appl. No.: 10,296

[22] Filed: Jan. 28, 1993

[30] Foreign Application Priority Data

Jan. 31, 1992 [JP] Japan ................................. 4-46300

[51] Int. Cl.$^6$ ................................................. H01L 21/76
[52] U.S. Cl. ..................... 437/62; 437/974; 148/DIG. 12
[58] Field of Search ................... 148/DIG. 12, DIG. 135; 437/86, 966, 62, 914, 974

[56] References Cited

U.S. PATENT DOCUMENTS

| | | |
|---|---|---|
| 3,909,332 | 9/1975 | Yerman . |
| 4,791,074 | 12/1988 | Tsunashima et al. . |
| 5,094,697 | 3/1992 | Takabayashi et al. ................ 136/249 |
| 5,213,986 | 5/1993 | Pinker et al. . |

FOREIGN PATENT DOCUMENTS

| | | |
|---|---|---|
| 0417838 | 3/1991 | European Pat. Off. . |
| 1189145 | 7/1989 | Japan . |
| 3173422 | 7/1991 | Japan . |
| 472608 | 3/1992 | Japan . |

OTHER PUBLICATIONS

"A New Thinning Method for Obtaining Less than 100-nm-Thick Si Film on Wafer Bonding" by Kazuo Imai; Japanese Journal Of Applied Physics; vol. 30 No. 6 Jun. 1991. pp. 1154–1157.

"Single-Crystal Silicon On Non-Single-Crystal Insulators" by G. W. Cullen; Extended Abstracts; vol. 91–2, Oct. 13–17, 1991; pp. 674–749 Fall Meeting Of The Electrochemist Society.

*Primary Examiner*—George Fourson
*Attorney, Agent, or Firm*—Fitzpatrick, Cella, Harper & Scinto

[57] ABSTRACT

A process for preparing a semiconductor substrate comprises bringing a first substrate provided with at least one of boron and phosphorus on the surface of an insulating layer formed on the surface of the substrate in contact with a second substrate, and integrating both of the substrates by a heat treatment.

5 Claims, 7 Drawing Sheets

PROCESS FOR PREPARING SEMICONDUCTOR SUBSTRATE BY BRINGING FIRST AND SECOND SUBSTRATES IN CONTACT

BACKGROUND OF THE INVENTION

1. Field of the Invention

The present invention relates to a semiconductor substrate and a process for the same, and more particularly to a semiconductor substrate by bonding and a process for preparing the same.

The present invention is suitably applied particularly to micromachine techniques, dielectric isolation techniques, SOI techniques, sensors, high power devices, communication high frequency band integrated circuit techniques, etc.

2. Related Background Art

Formation of a monocrystalline Si semiconductor layer on an insulator is widely known as a silicon-on-insulator (SOI) technique and has been extensively studied because devices based on utilization of the SOI technique have many advantages that have not been obtained in case of bulk Si substrates for preparing ordinary Si integrated circuits. That is, the following advantages can be obtained by utilizing the SOI technique:

1. Easy dielectric isolation with a possibility of higher level integration,
2. Distinguished resistance to radiation,
3. Reduced floating capacity with a possibility of higher speed,
4. Omission of well formation step,
5. Prevention of latch-up,
6. Possibility to form a fully deplated, field effect transistor by thin film formation, etc.

To obtain the above-mentioned many advantages of device characteristics, processes for forming the SOI structure have been studied for these more than ten years. The results are summarized, for example, in the following literature: Special Issue: "Single-crystal silicon on non-single-crystal insulators", edited by G. W. Cullen, Journal of Crystal Growth, Volume 63, No. 3, pp 429–590 (1983).

Among many SOI techniques, SOS (silicon-on-sapphire) formed by heteroepitaxial growth of a silicon film on a monocrystalline sapphire substrate by CVD (chemical vapor phase deposition) method disclosed in the past as a research example has advanced to such a level as to form practical integrated circuits, using monocrystal as a silicon layer and regarded as a successful, matured SOI technique. However, its wide application was interrupted by the occurrence of many crystal defects due to lattice mismatching at the interface between the Si layer and the underlayer sapphire substrate, by diffusion of aluminum into the Si layer from the sapphire substrate, and largely by a high cost of the substrate and delay in response to the formation of larger area.

Recently, some attempts have been made to form an SOI structure without using the sapphire substrate. The attempts can be classified into the following three major groups.

(1) After the surface oxidation of a silicon monocrystalline substrate, windows are made in a part of the oxide film to partially expose the silicon substrate, and a silicon monocrystalline layer is formed on the $SiO_2$ by epitaxial growth of silicon in the lateral direction, while utilizing the exposed silicon substrate as a seed.

(2) A silicon monocrystalline substrate itself is utilized as an active layer and an $SiO_2$ embedded layer is formed below by some means.

(3) After the silicon substrate is bonded to an insulating substrate, the silicon substrate is polished or ground or etched to leave the monocrystalline layer having a desired thickness.

Basically three processes are available as a means of realizing the above group (1): a process for direct epitaxial growth of a monocrystalline silicon layer in the lateral direction by CVD (gas phase process); a process for deposition of amorphous silicon and successive epitaxial growth in the lateral direction in the solid phase by heat treatment (solid phase process); and a process for irradiation of an amorphous or polycrystalline silicon layer with a converged energy beam such as an electron beam, a laser beam, etc. to make a monocrystalline silicon layer grow on $SiO_2$ through melting and recrystallization or scanning a melt zone by a rod heater bandwise (zone melting recrystallization ) ( liquid phase process ).

These processes have advantages and disadvantages together, and still have many problems in the controllability, productivity, uniformity and quality, and thus have been hardly commercially used yet. For example, the CVD process requires grinding technique of good controllability or sacrificial oxidation to form a flat thin film, whereas the solid phase growth process suffers from poor crystallinity. The beam anneal process has problems in the treating time by scanning with the converged beam, the state of overlapped beams, focus adjustment, etc. Among them, the zone melting recrystallization process is the most matured process, by which relatively large integrated circuits have been made on trial, but there remain still many crystal defects such as quasigrain boundaries, etc. and thus minority carrier devices have not yet been made.

The technique now advanced by research and development by so many research organizations as a means of realizing the above group (2) is a process for forming a $SiO_2$ layer by oxgen ion implantation into a silicon monocrystalline substrate, called SIMOX (separation by ion implanted oxygen). This technique is now the most matured one because of good matching with the silicon process. However, in order to form the $SiO_2$ layer, oxygen ions must be implanted at least at $10^{18}$ ions/cm$^2$ and the implantation time is very long and the productivity is not so high. The wafer cost is also high. Furthermore, there remain many crystal defects. That is, no commercially satisfactory quality for making minority carrier devices can be obtained.

Besides SIMOX a process for forming SOI structure by dielectric isolation on the basis of oxidation of porous silicon is known. The process comprises forming an n-type silicon layer of island shape on the surface of a p-type silicon monocrystalline substrate by proton ion implantation (Imai et al: J. crystal Growth, Vol. 63, 547 (1983)) or by epitaxial growth and patterning, then making only the p-type silicon substrate porous by anodization in a HF solution so as to surround the silicon islands from the surface, and then dielectrically isolating the n-type silicon island by accelerated oxidation. This process has a problem that since the isolated silicon is determined before a device step the degree of freedom in a device design is limited.

As a means of realizing the above group (3), there is a technique of making the mirror surfaces of two wafers where an insulating film is formed on at least one of the mirror surfaces by oxidation, etc. to tightly adhere to each other, subjecting the wafers to a heat treatment to strengthen the bonding at the tightly adhered interface, and then grinding or etching the bonded wafers from one side thereof thereby leaving a silicon monocrystalline thin film having a desired thickness on the insulating film. This technique is called "bonding SOI", and there are many problems to be solved in this technique. The most important problem is in a step of making the silicon substrate into a uniformly thin film. That is, a silicon substrate usually having a thickness of several hundred µm must be ground or etched uniformly to a thickness of several µm or less than 1 µm. This is technically very difficult from the viewpoint of controllability and uniformness. This technique has a possibility to provide a monocrystalline thin film of best quality in the SOI techniques, but has not been used in the commercial production because of the difficulty in the film thickness control.

Another important problem is a generation of a stress due to a difference in the coefficient of thermal expansion between two substrates, where an insulating substrate other than the silicon substrate is used as a support member. That is, there is substantially no problem when a silicon substrate is used as a support member (that is, bonding of two silicon substrates), but when other insulating substrate than silicon, for example, glass, is used as a support member, the substrates are sometimes warped, while keeping the bonding, or cracked or separated from each other due to a difference in the coefficient of thermal expansion in the heat treatment step at about 1,000° C. for strengthening the interface bonding after the two substrates are bonded together. There are cases of synthesizing materials having similar coefficients of thermal expansion to that of silicon and using them as a support substrate, but to our knowledge such synthetic materials have poor heat resistance and cannot endure the heat treatment for strengthening the bonding or the process temperature for forming devices.

Beside these problems, how to suppress the generation of voids (empty spaces formed at the bonding interface) is also a problem. There are many theories on the cause for generation of such voids. According to one theory, oxygen atoms or hydroxy groups covering the surfaces of bonded substrates mainly undergo dehydration and condensation to generate water vapors, and the generated water vapors get together to form voids. The thus generated voids can be made to disappear by further heat treatment at a higher temperature, thereby diffusing the vapors. Surface unevenness caused by dusts, scars etc. on the surface of the substrate will positively generate voids, and the voids generated by the surface unevenness of the substrate are very difficult to make to disappear.

As disclosed, for example, in the first international symposium on semiconductor wafer bonding science, technology, and applications, Extended Abstract of Fall meeting of Electrochemical Society, Phoenis, Ariz. Oct. 13–17, 1991, pp 674–749, the application of substrate bonding technique has been regarded as important in the field of not only SOI, but also micromachine structures, sensors, etc. and a substrate bonding technique capable of suppressing the generation of voids, and releasing the stresses generated at the bonding of substrates having different coefficients of thermal expansion, thereby preventing warpings has been keenly desired.

As described above, the technique capable of providing SOI substrates good enough to prepare electronic devices of improved characteristics with a high productivity has not been established yet.

SUMMARY OF THE INVENTION

An object of the present invention is to provide a semiconductor substrate, where generation of fine voids due to the surface unevenness of bonded substrates is suppressed when an SOI substrate of high characteristics is prepared by bonding, and a process for preparing the same.

Another object of the present invention is a process for preparing a semiconductor substrate capable of releasing the stresses on a substrate when a silicon monocrystalline film is formed on the substrate having a different coefficient of thermal expansion from that of silicon.

A still another object of the present invention is to provide a process for preparing a semiconductor substrate which comprises bringing a first substrate provided with at least one of boron and phosphorus on the surface of an insulating layer formed on the surface of the substrate in contact with a second substrate, and heating the two substrates, thereby integrating the substrates.

DETAILED DESCRIPTION OF THE PREFERRED EMBODIMENTS

According to a first aspect of the present invention, there is provided a process for preparing a semiconductor substrate which comprises bringing a first substrate provided with at least one of boron and phosphorus on the surface of an insulating layer formed on the surface of the substrate in contact with a second substrate, and heating the two substrates, thereby integrating the substrates.

According to a second aspect of the present invention, there is provided a process for preparing a semiconductor substrate which comprises bringing a first substrate and a second substrate each provided with at least one of boron and phosphorus on the surfaces of insulating layers formed on the surfaces of the substrates in contact with each other so that the insulating layers are in contact with each other, then heating the substrates, thereby integrating the substrates. According to a third aspect of the present invention, there is provided a process for preparing a semiconductor substrate which comprises a step of making an entire silicon monocrystalline substrate as a first substrate porous by anodization, a step of making a silicon monocrystalline thin film to epitaxially grow on one of the porous surfaces, a step of oxidizing the surface of the silicon monocrystalline thin film, a step of forming an insulating layer capable of softening by heat treatment on the oxidized surface, a step of making the insulating layer of the first substrate to tightly adhere to a second substrate, and a step of heat treating the first substrate and the second substrate tightly adhered to each other and then selectively etching the porous regions.

According to a fourth aspect of the present invention, there is provided a process for preparing a semiconductor substrate which comprises a step of making the surface layer on one side of a silicon monocrystalline substrate as a first substrate porous by anodization, a step of making a silicon monocrystalline thin film to epitaxially grow on the porous surface, a step of oxidizing the surface of the silicon monocrystalline thin film, a step of forming an insulating layer capable of softening by heat treatment on the oxidized surface, a step of making the insulating layer of the first substrate to tightly adhere to a second substrate, and a step of heat treating the first and second substrates tightly adhered to each other, then removing non-porous monocrystalline substrate regions of the first substrate, and then selectively etching the porous silicon regions.

According to a fifth aspect of the present invention, there is provided a semiconductor substrate prepared according to any one of the above-mentioned processes.

In the present process for preparing a semiconductor substrate, the viscosity characteristics with respect to temperatures at the bonding interface are changed by introducing an impurity to the region near the bonding interface, and microscopic unevenness existing at the bonding interface is filled up by promoted viscous movement of substances in the region near the bonding interface, thereby making the unevenness to decrease or disappear completely. That is, unbonded regions appearing at the bonding interface and the consequent voids, which are the most important problem in the wafer bonding technology, can be made to decrease or disappear completely for the first time.

Reflow of boron-phosphorus glass is known as one of the flattening procedures in the semiconductor integrated circuit production technique (R .A. Levy, K. Nassau: Solid State Technology, Japanese Edition, pp 69–71, November issue, 1986). Recently, Imai disclosed that voids can be reduced on the substrates having surface level differences by the presence of boron-phosphorus glass (Japanese Journal of Applied Physics, Vol. 30, No. 6, June, 1991, pp 1154–1157).

However, our extensive researches revealed that the surface of the glass deposited by chemical vapor deposition process, as disclosed in the above-mentioned report, had considerable unevenness and could not be used for bonding as such. Furthermore, the remaining of a large amount of boron and phosphorus, which serve as acceptors and donors, in the region near the bonding interface is a serious problem in the production of electronic devices, optical devices and micromachines.

In the present invention, an impurity capable of changing the viscosity of an insulating layer is imparted as a small amount of accelerated charged particles with a good controllability only to the surface of the thermally oxidized film maintaining a surface flatness of atomic level to form a viscous flow-promoting intermediate layer with a very high flatness, and the void-free bonding step as desired can be established for the first time.

When other materials than silicon, for example, quartz, is used as a second substrate serving as a support member, the entire substrates are considerably warped or the silicon film is peeled off or broken due to a difference in the coefficient of thermal expansion from the silicon substrate, and thus it is quite difficult to bond substrates of different materials to each other and subject the bonded substrates to heat treatment. However, when there is a viscous flow-promoting intermediate layer between the two materials and the intermediate layer is softened by heat treatment, the stresses generated between the different materials are released and warping, etc. of the substrates can be largely controlled. Thus, bonding of different materials to each other can be made possible.

A Preferable concentration of boron or phosphorus to be imparted to the surface of an insulating layer according to the present invention is not less than about 10% of $B_2O_3$ or not more than about 20% of $P_2O_5$ in $SiO_2$ in case of diffusion. By the addition at that concentration, the surface of the insulating layer can be softened within the process temperature (1100° C.). In case of the presence of $P_2O_5$ or $B_2O_3$ at the above-mentioned concentrations, softening starts at about 700° C.

When imparting of boron or phosphorus is carried out by ion implantation, a preferable amount of implanted ions is $1\times10^{20}$ cm to $5\times10^{21}$ cm$^{-3}$.

According to the present process for preparing a semiconductor substrate, a monocrystalline silicon layer is made to epitaxially grow on the porous surface of a silicon substrate, whose surface is partially or entirely made porous, and the epitaxially grown surface is oxidized. Then, a heat-softening insulating layer is formed on the oxidized surface to prepare a first substrate. The surface of the first substrate is heat treated to make the insulating layer to flow, thereby flattening the surface. Then, a second substrate serving as a support substrate is brought in tight contact with the first substrate. After the tight contact, the substrates are heat treated at a high temperature. Then, the porous silicon layer is selectively etched to obtain a silicon monocrystalline thin film (SOI) on the second substrate through the heat-softening insulating layer and the silicon oxide film. The silicon monocrystalline thin film is an epitaxial layer itself, and thus the film thickness can be highly controlled. On the oxidized surface of the epitaxial layer of the first substrate, unevenness, etc. due to the unevenness of the porous layer as the underlayer or due to the accelerated oxidation of crystal defects of epitaxial layer appear, and complete evenness is often not obtained. However, the heat-softening insulator deposited on the oxidized surface of the epitaxial layer effectively fills the unevenness at the interface and the flatness of the interface can be obtained by the flow of the heat-softening insulator.

In the practice of the present invention, the porous silicon has the following two important physical effects, one of which is an etching characteristic of porous silicon. Usually, silicon is hardly etched by hydrofluoric acid, but silicon made porous can be etched by hydrofluoric acid. Furthermore, with a liquid etching mixture of hydrofluoric acid, hydrogen peroxide and an alcohol, the porous silicon can be etched at a higher etching rate by about $10^{-5}$ or more than the non-porous silicon. Thus, a thin layer having a thickness of even about 1 μm can be selectively etched uniformly with a good controllability.

Another effect is an epitaxial growth characteristics. Porous silicon retains a monocrystalline structure as a crystal structure, and has pores having diameters of several tens to several hundreds Å extending from the surface inwards at a high density. An epitaxial layer growing on that surface can have a crystallinity equivalent to that of the epitaxial layer growing on a nonporous monocrystalline substrate. This is the characteristic. Thus, a monocrystalline thin film equivalent to the epitaxial layer growing on the monocrystalline silicon substrate of high reliability can be used as an active layer, and an SOI substrate having an excellent crystallinity, as compared with the conventional SOI substrate, can be provided in the present invention.

The present invention will be described in detail below, referring to the embodiments and the drawings.

Embodiment 1

Figure 1:
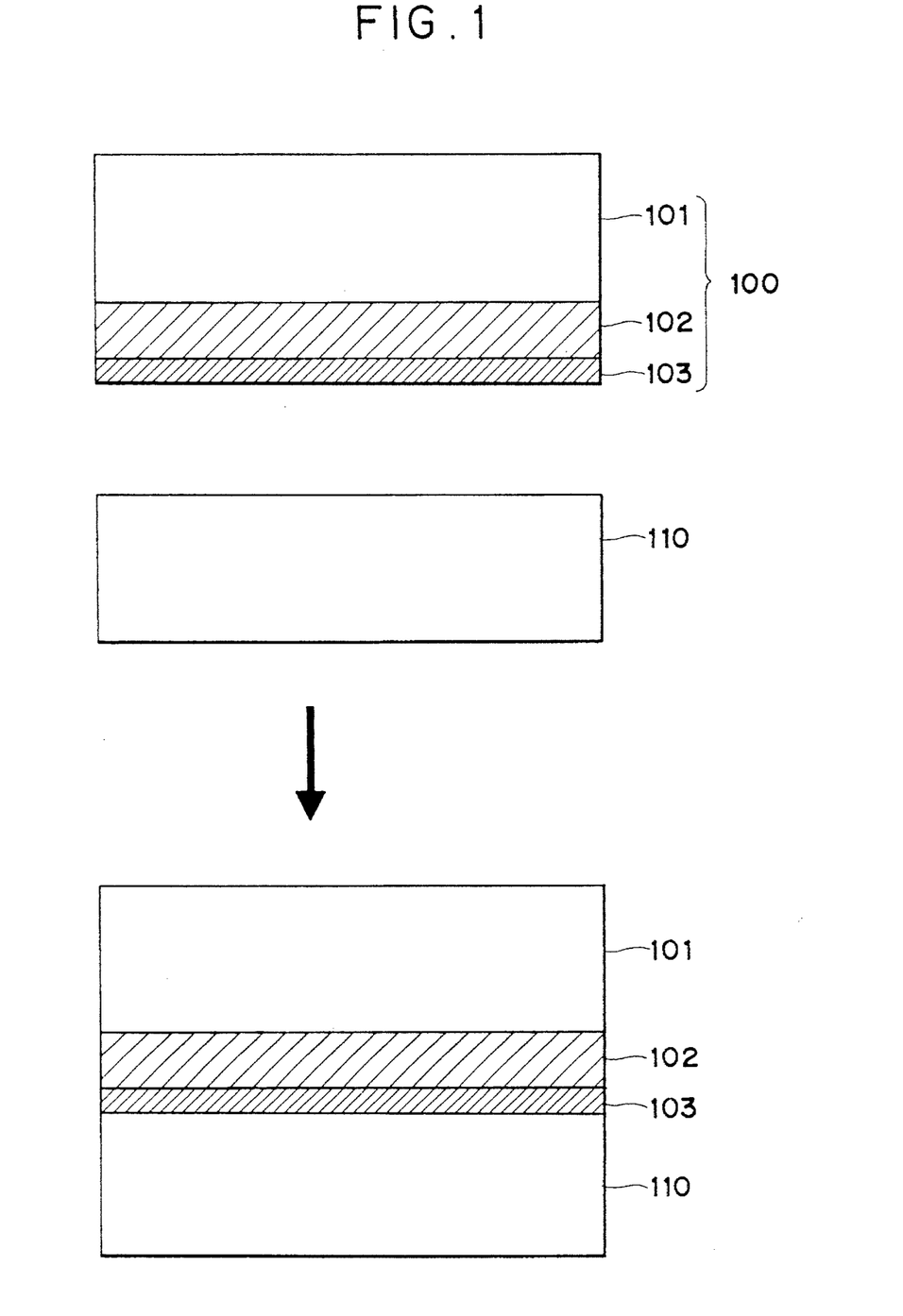
FIGS. 1, 2, 3A–3F, 4A–4F, 5A–5F and 6A–6F are schematic views showing one example of the process for preparing a semiconductor substrate according to the present invention.

In FIG. 1, a first substrate 100 and a second substrate 110 are composed of a single element semiconductor such as silicon, germanium, etc., a compound semiconductor such as gallium-arsenic, indium-phosphorus, etc., or glass such as transparent insulating quartz, etc.

At first, a flat insulating layer 102 is formed on the surface of the first substrate. In case that the first substrate is composed of silicon, the most suitable insulating layer 102 is a thermally oxidized film, and quantitative determination of the flatness by an interatomic force microscope reveals that a very flat surface having an unevenness of a few nanometers in the thickness direction is formed. However, as has been mentioned before, referring to the prior art, there are very fine unbonded regions at the bonding interface due to various causes, and it is very hard to obtain completely bonded interface characteristics. Main causes for incomplete bonding interface, or unbonded regions, occurrences of voids in the region near the interface seem to be local surface stainings, scars, level differences of crystal face, warping, etc., but have not been determined yet. When stable and thermally oxidized layer is not obtained at the interface like a compound semiconductor, the insulating layer is formed by chemical vapor deposition, particularly vacuum deposition or by sputtering.

Then, an impurity capable of promoting a viscous flow of the oxide is added to the surface of the insulating layer 102, preferably down to about 100 nm maximum. In case the insulating layer is composed of silicon oxide, it is preferable to add boron or phosphorus thereto as an impurity. The addition can made by implantation of accelerated charged particles, that is, ion implanting, or by thermal decomposition, adsorption from a gas phase and deposition. In this manner, a viscous flow-promoting layer 103 can be formed on the surface of the insulating layer without deteriorating the flatness of the insulating layer.

The first substrate 100 and a second substrate 110 are carefully washed, dried and firmly bonded each other while heating the bonded substrates at least to a temperature where the viscosity of the viscous flow-promoting layer 103 is lowered. Though the flatness is very high, very fine voids due to the steps equivalent to the atomic surface can be made disappear by the viscous flow of the viscous flow-promoting layer.

Embodiment 2

Figure 2:
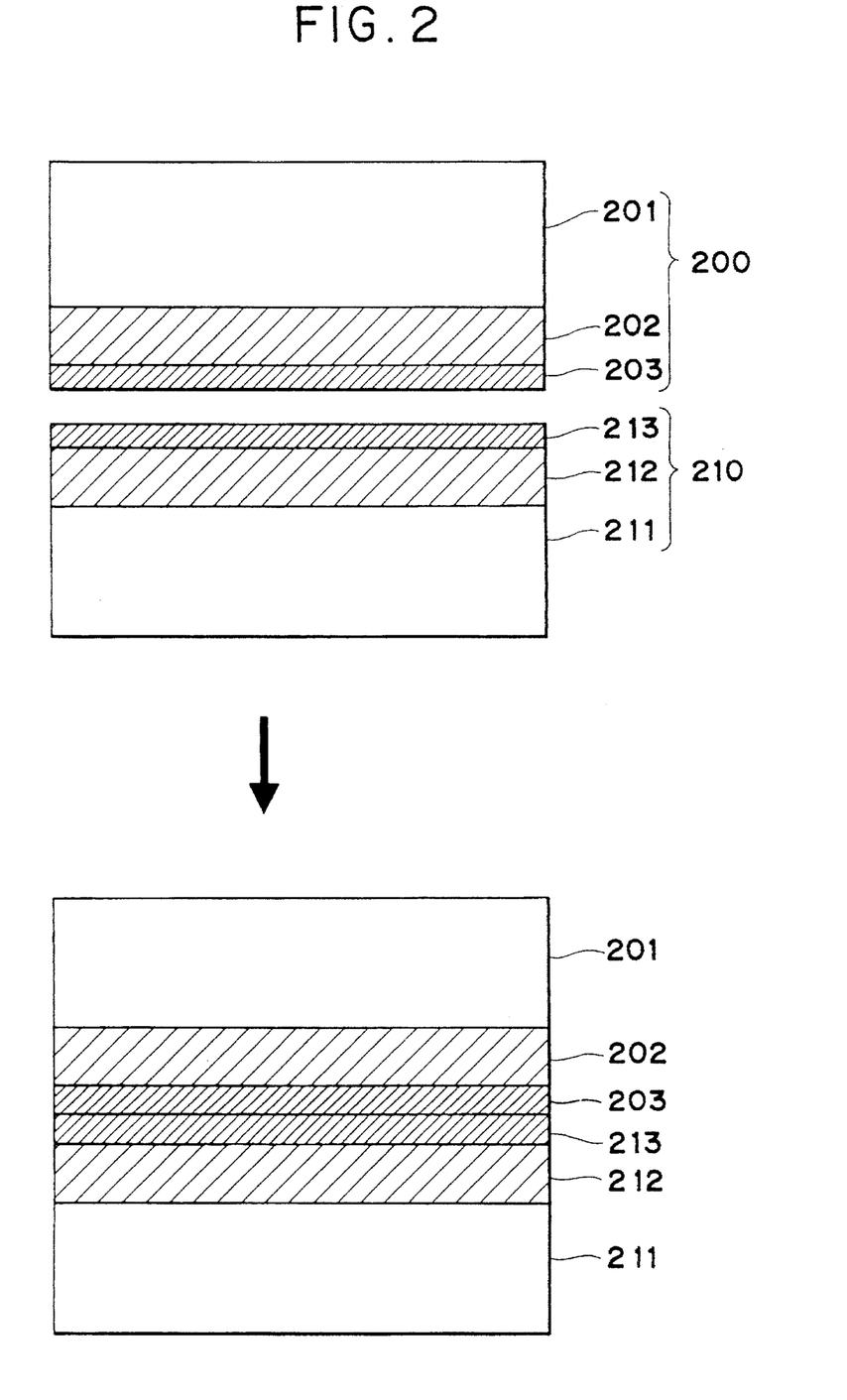

According to an embodiment of the present invention shown in FIG. 2, insulating layers 202 and 212 are provided on a first substrate 200 and a second substrate 210, respectively, and viscous flow-promoting layers 203 and 213 are also provided on the surfaces of the insulating layers 202 and 212, respectively where even voids due to much larger surface unevenness can be made effectively to disappear.

Embodiment 3

Another embodiment of the present invention will be explained, referring to FIGS. 3A to 3F and 7A to 7B.

Figure 3A:
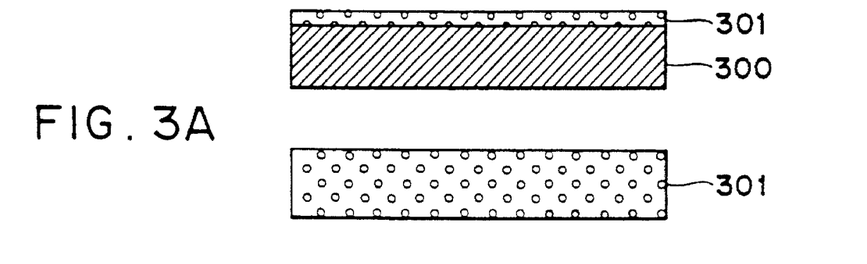

As shown in FIG. 3A, a monocrystalline silicon substrate 300 is anodized to form porous silicon 301. The region to be made porous can be only a surface layer on one side of the substrate or can be extended to the entire substrate. In case of making the surface layer on one side porous, the region to be made porous can be extended to a thickness of 10 to 100 µm.

Procedure for forming porous silicon will be explained, referring to FIGS. 7A and 7B.

Figure 7A:
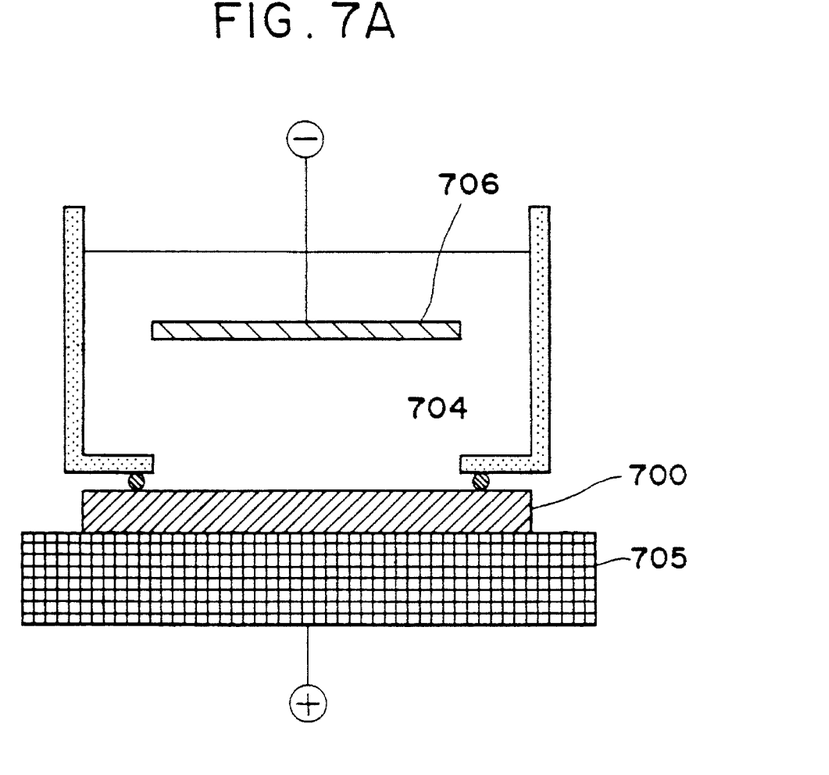
FIGS. 7A and 7B are schematic views showing one example of apparatuses for making a silicon substrate porous.

A p-type monocrystalline silicon substrate 700 is provided as a substrate and set in an apparatus shown in FIG. 7A. The substrate 700 may be of n-type, but must be limited to a substrate of low resistance in that case. One side of the substrate 700 is in contact with a hydrofluoric acid-based solution 704, and a negative electrode 706 is provided on the solution side, and a positive metallic electrode 705 is in contact with the substrate 700 on the other side.

Figure 7B:
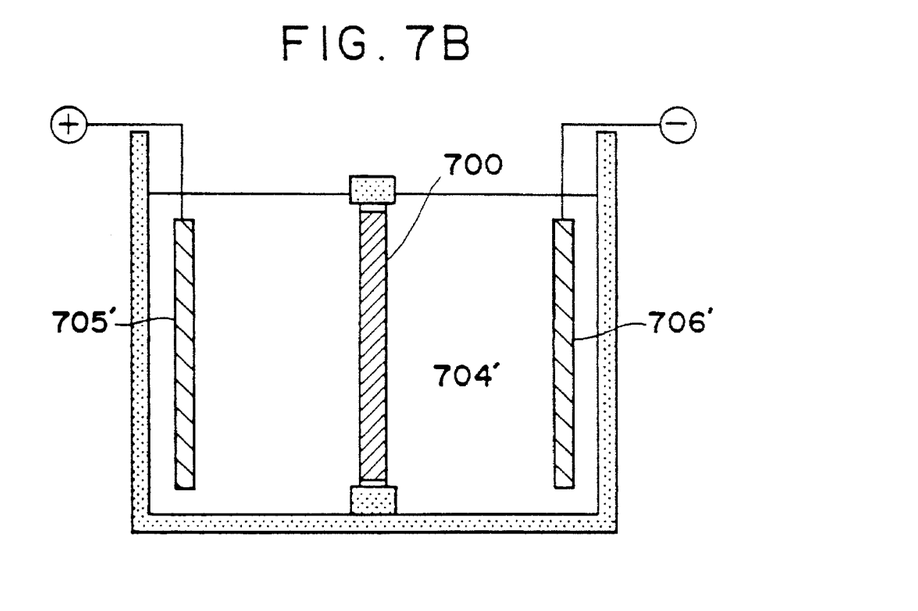

As shown in FIG. 7B, the positive electrode 705' may be provided in the solution 704' to apply a potential. In any way, the substrate 700 is made porous on the negative electrode side in contact with the hydrofluoric acid-based solution. As the hydrofluoric acid-based solution 704, a concentrated hydrofluoric acid (49% HF) is usually used. When the concentrated hydrofluoric acid is gradually diluted with pure water ($H_2O$), etching will take place unprefeventially at some concentration, though dependent on a current density of an electric current to be passed. Since bubbles are generated on the surface of the substrate 700 during the anodization, an alcohol is added thereto as a surfactant in some cases to efficiently remove the bubbles. As an alcohol, methanol, ethanol, propanol, isopropanol, etc. can be used. In place of addition of the alcohol, anodizing can be carried out while stirring the solution with a stirrer.

The negative electrode 706 is composed of a material that is not corroded by the hydrofluoric acid-based solution, for example, gold (Au), platinum (Pt), etc. The positive electrode 705 can be composed of a metallic material in the ordinary use, and when the entire substrate 700 is anodized, the hydrofluoric acid-based solution 704 reaches the positive electrode 705, and thus it is preferable to coat the surface of the positive electrode 705 with a hydrofluoric acid-resistant metallic film.

A current density for the anodizing is several hundreds $mA/cm^2$ at maximum, and its minimum may be any value except zero. The current density depends on a range capable of epitaxial growth of good quality on the surface of the porous silicon. The higher the current density, usually the higher the rate of anodization and the lower the density of the porous silicon layer, that is, the larger the volume occupied by the pores. That is, conditions for the epitaxial growth are changed thereby.

Figure 3B:
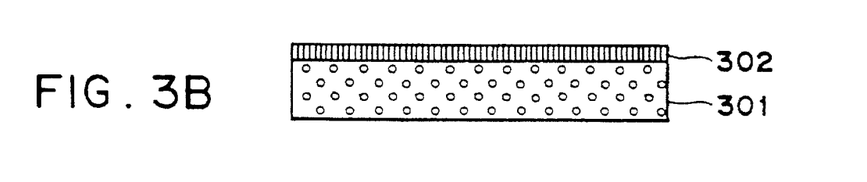

A non-porous monocrystalline silicon layer 302 is made to epitaxially grow on the thus formed porous silicon substrate or porous layer 301 (FIG. 3B). Epitaxial growth is carried out by ordinary thermal CVD, low pressure CVD, plasma CVD, molecular beam epitaxy, sputtering or the like. The thickness of the nonporous monocrystalline silicon layer thus formed must be equal to the design thickness of an SOI layer.

Figure 3C:
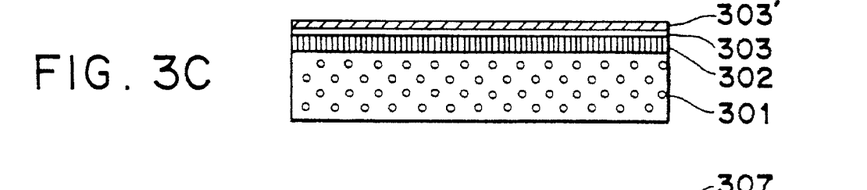

An $SiO_2$ layer 303 is formed by oxidizing the surface of the thus formed epitaxial layer 302 (FIG. 3C). The oxidation step has two meanings: one is an effect on a decrease in the interfacial level density of the epitaxial layer 302 as an active layer to the insulating underlayer interface when a device is formed on the finished SOI substrate, and another is an effect on suppression of diffusion from an impurity from an heat softening insulator (viscous flow-promoting layer) to be formed thereon in the next step. To further suppress the diffusion of the impurity to the epitaxial layer 302, it is more effective to deposit a silicon nitride film 303' on the epi-oxide film 303. It is preferable for obtaining these two effects that the epi-oxide film has a thickness of 0.5 to 1.0 μm. When the epi-oxide film is used in combination with such a diffusion-preventing film as a silicon nitride film, etc., the thickness may be a little smaller. It is preferable that the silicon nitride film 303' has a thickness of 0.1 to 0.5 μm. When the thickness is smaller, the effect of the diffusion prevention will be lower, whereas when the thickness is larger, the silicon nitride film will be cracked due to internal stress of the film itself.

Figure 3D:
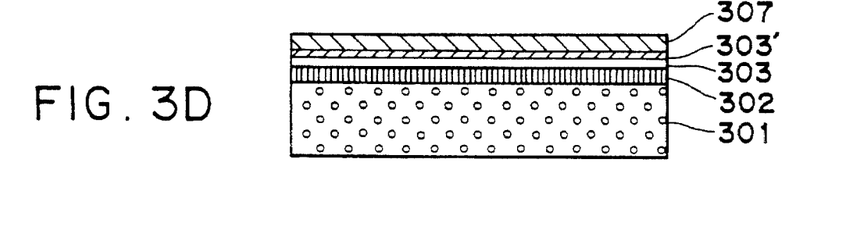

Then, a heat softening insulator (viscous flow-promoting layer) 307 is deposited on the surface of oxide layer 303 or nitride layer 303' (FIG. 3D). The deposition is carried out usually by thermal CVD method, plasma CVD method or the like which comprises introducing an impurity gas such as $PH_3$, $B_2H_6$, etc. while decomposing an Si source gas such as $Si_4$, $Si_2H_6$, $SiH_2Cl_2$, etc. by oxidation. The thus obtained heat softening insulator 307 is an $SiO_2$ film containing a large amount of phosphorus (P) or boron (B) or these two, which are called PSG, BSG or BPSG, respectively. The higher the concentration of impurity in $SiO_2$, that is, phosphorus or boron concentration, the lower the softening start temperature of the $SiO_2$ film. The film thickness of heat softening insulator 307 can be selected, as desired, and is preferably about 0.1 μm to about 1.0 μm as a readily formable range by the ordinary process. In some cases the surface of the insulating film obtained by CVD has a considerable unevenness. The flatness of substrate is important in the bonding of substrates, it is preferable to heat treat the substrates so as to flatten the unevenness. Heat treatment temperature must be higher than the softening point (flowing temperature) of the deposited heat softening insulator 307.

The first substrate is prepared by the foregoing steps.

Figure 3E:
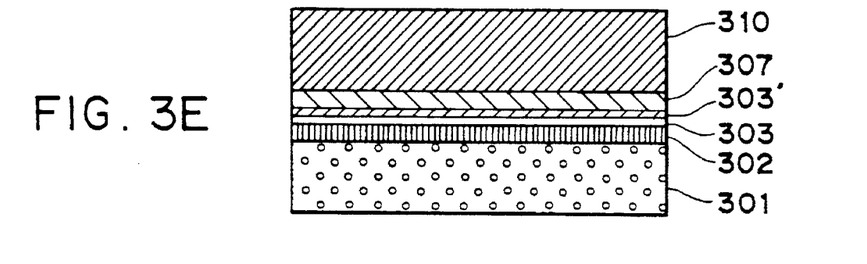

Then, the first substrate and a second substrate 310 are bonded to each other at their mirror surfaces, and the bonded substrates are subjected to heat treatment (FIG. 3E). The heat treatment temperature is a flow temperature of the heat softening insulator deposited on the first substrate or higher. The second substrate 310 is not particularly limited and is selected from a silicon substrate, a quartz substrate or other ceramic substrates.

Figure 3F:
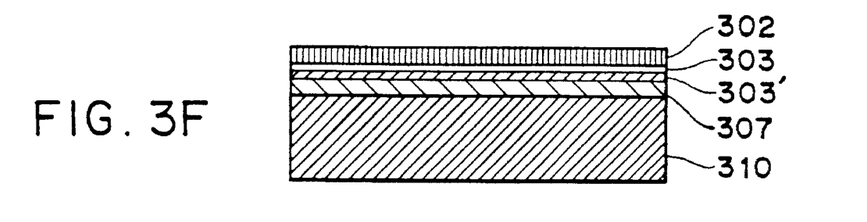

Then, the porous region 301 and others are selectively removed from the first substrate side, while leaving the epitaxial growth layer 302 (FIG. 3F). When the region to be removed extends the entire porous substrate 301, the entire bonded substrates are dipped in a hydrofluoric acid-based solution, whereby the entire porous region 301 can be selectively etched. When the region to be etched contains a monocrystalline silicon substrate 300 as such, it is preferable to remove only the region of silicon substrate 300 by grinding, and when the porous region 301 is exposed, the grinding is completed and then the selective etching is carried out in the hydrofluoric acid-based solution. In any case, the monocrystalline epitaxial growth region 302 which is not porous, does not substantially undergo reaction with the hydrofluoric acid-based solution and thus remains as a thin film. When the second substrate 310 is composed mainly of $SiO_2$, it readily reacts with the hydrofluoric acid-based solution, and thus it is preferable to deposit a silicon nitride film or other substance hardly reactable with hydrofluoric acid on the opposite side to the bonding side by CVC, etc. in advance. When the porous region 301 is made thinner to some extent before dipping the substrates into the etching solution, the time required for the selective etching of the porous region can be shortened, and thus the second substrate can be prevented from unwanted reaction. When the second substrate is composed of Si which is not reactable with hydrofluoric acid, there are no such problems as above.

The hydrofluoric acid-based solution for the selective etching is a liquid mixture of hydrofluoric acid and hydrogen peroxide ($H_2O_2$) and/or an alcohol. Even a liquid mixture of hydrofluoric acid and nitric acid or further containing acetic acid can selectively etch the porous silicon, but the epitaxial silicon film 302 to be retained will be also etched to some extent in that case, and thus it is necessary to control the etching time, etc. exactly.

Through the foregoing steps, an SOI substrate comprising the second substrate 310, the heat softening insulator 307, the silicon oxide film 303 and the epitaxial silicon layer 302, successively laid thereon, can be obtained.

The present invention will be explained in detail below, referring to the examples, but the present invention is not limited thereto.

EXAMPLE 1

A thermally oxidized film having a thickness of 0.5 μm was formed on the surface of a p-type (100) monocrystalline silicon substrate, 5 inches in diameter, and 0.1 to 0.2 Ω·cm in resistivity as a first substrate, and a viscous flow-promoting layer was formed in the surface layer to a depth of 0.1 μm from the surface of the thermally oxide film by ion implantation of boron and phosphorus onto the surface of the thermally oxidized film. The viscous flow-promoting layer contained $1\times10^{20}$ atoms/cm³ each of boron and phosphorus. Then, the first substrate was washed with a liquid mixture of hydrochloric acid, hydrogen peroxide and water and dried, and was tightly bonded to a monocrystalline silicon substrate as a second substrate, 5 inches in diameter, washed in the same manner as above, at room temperature. Then, the bonded substrates were heat treated in a nitrogen atmosphere at 1000° C. for 20 minutes. Observation of the bonded substrates by an X-ray topography revealed that there were no voids, and the tensile strength test showed that the bonding strength was 1000 kgf/cm² or higher.

The first substrate of the bonded substrates was ground and polished to a thin film having a thickness of 1 μm. When five voids (less than 10 μm in diameter) were detected with an optical microscope, no such voids were not found at all.

EXAMPLE 2

An epitaxial layer was formed on a p-type (100) silicon monocrystalline substrate having a resistivity of 0.01 Ω·cm as a first substrate to a thickness of 1.5 μm. The surface of the epitaxial layer was thermally oxidized to a depth of 0.5 μm in the same manner as in Example 1, and then $1\times10^{21}$ atoms/cm³ of phosphorus was ion-implanted into the surface region of the thermally oxidized layer to a depth of 0.1 μm.

As a second substrate, a silicon substrate provided with a thermally oxidized film having a thickness of 1 μm by thermally oxidation and a boron-implanted surface region containing $1\times10^{20}$ atoms/cm³ of boron on the surface of the thermally oxided film is formed. Both substrates were washed with a liquid mixture of hydrochloric acid, hydrogen peroxide and water, dried and tightly bonded to each other at room temperature. Then, the bonded substrate was heat treated in a nitrogen atmosphere at 1100° C. for 60 minutes.

Observation of the bonded substrates revealed that there were no voids, and the tensile strength test revealed that the bonding strength was 1200 kgf/cm² or higher.

EXAMPLE 3

An epitaxial layer was formed on a p-type (100) silicon monocrystalline substrate having a resistivity of 0.01 Ω·cm as a first substrate to a thickness of 1.5 μm. The surface of the epitaxial layer was thermally oxidized to a depth of 0.5 μm, and then $1\times10^{21}$ atoms/cm$^3$ each of boron and phosphorus was ion-implanted into the surface region of the thermally oxidized layer to a depth of 0.1 μm.

As a second substrate, a fused quartz substrate ion-implanted with $1\times10^{20}$ atoms/cm$^3$ each of boron and phosphorus into the surface region to a depth of 0.1 μm and then both substrates were washed with a liquid mixture of hydrochloric acid, hydrogen peroxide and water, dried and tightly bonded to each other at room temperature. Then, the bonded substrate was heat treated in a nitrogen atmosphere at 200° C. for 6 hours.

Observation of the bonded substrates revealed that there were no voids, and the tensile strength test revealed that the bonding strength was 500 kgf/cm$^2$ or higher.

EXAMPLE 4

The fourth example of the present invention will be explained in detail, referring to FIGS. 3A to 3F and 7A to 7B.

A p-type (100) monocrystalline silicon substrate having a thickness of 200 μm, a resistivity of 0.1 to 0.2 Ω·cm and a diameter of 4 inches was set in an apparatus as shown in FIG. 7A and subjected to anodization to obtain porous silicon 301 (FIG. 3A).

As a solution 704, 49% HF solution was used at a current density of 100 mA/cm$^2$. The rate of making the substrate porous was 8.4 μm/min. and the p-type (100) silicon substrate having a thickness of 200 μm was entirely made porous within 24 minutes.

A monocrystalline silicon layer 302 was made to epitaxially grow on the p-type (100) porous silicon substrate 301 to a thickness of 1.0 μm by CVD method under the following deposition conditions (FIG. 3B).

Source gas: SiH$_4$/H$_2$
Gas flow rate: 0.62/140 (liter/min.)
Temperature: 750° C.
Pressure: 80 Torr
Growth rate: 0.12 μm/min.

The surface of the expitaxial growth layer 302 was oxidized in a steam atmosphere at 1000° C. to obtain as SiO$_2$ 303 film having a thickness of 0.5 μm (FIG. 3C).

A BPSG film 307 was deposited on the oxide film 303 to a thickness of 0.7 μm by thermal CVD, using a gas mixture of SiH$_4$, O$_2$, PH$_3$ (diluted with N$_2$), and B$_2$H$_6$(diluted with N$_2$) (FIG. 3D). Furthermore, to flatten fine unevenness on the surface of the BPSG film, the substrate was heat treated in an oxygen atmosphere at 1000° C. for 30 minutes. The substrate prepared in this manner was used as a first substrate.

The first substrate and another silicon substrate 310 as a second substrate were washed with a solution of HCl, H$_2$O$_2$ and H$_2$O, and then thoroughly washed with water. Then, the first substrate and the second substrate were bonded to each other at the mirror surfaces and the bonded substrates were heat treated in a nitrogen atmosphere at 1100° C. for 2 hours to increase the bonding force at the interface between the bonded substrates (FIG. 3E).

After the heat treatment, the tightly bonded substrates were dipped in a selective etching solution to selectively etch only the porous portion 301 (FIG. 3F). Composition of the etching solution and the etching rate of porous silicon are as follows:

HF:H$_2$O$_2$:C$_2$H$_5$OH=5:25:6, and

Etching rate:1.6 μm/min.

The porous portion having a thickness of 200 μm was entirely etched within about 125 minutes, where the etching rate of monocrystalline silicon layer 302 was 0.0006 μm/hour and the monocrystalline silicon layer 302 remained without substantial etching.

Through the foregoing steps, an SOI substrate comprising the BPSG film 307, the silicon oxide film 303 and the epitaxial layer 302 successively formed on the silicon substrate 310, was obtained.

EXAMPLE 5

The fifth example of the present invention will be explained in detail, referring to FIGS. 4A to 4F.

Figure 4A:
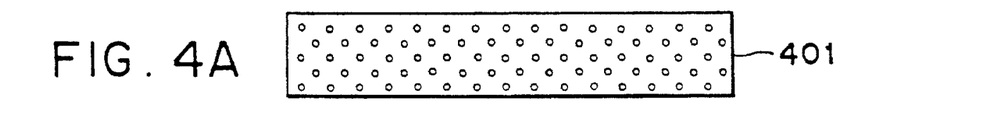
Figure 4B:
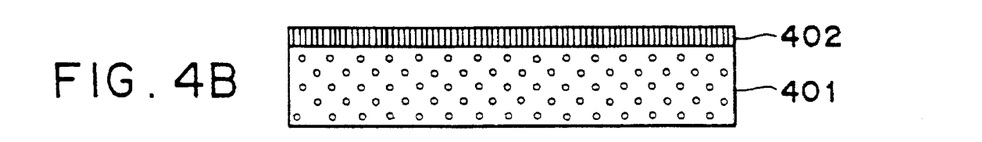

A p-type (100) silicon substrate 400 having a thickness of 400 μm and a resistivity of 0.01 Ω·cm was made entirely porous to form a porous substrate 401 in the same manner as in Example 4 (FIG. 4A).

Figure 4C:
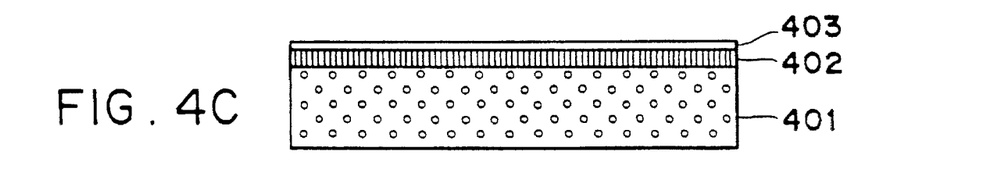
Figure 4D:
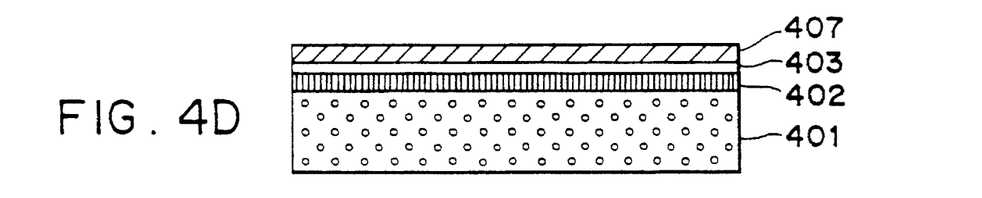

Then, an epitaxial layer 402 was formed on one surface of the substrate to a thickness of 0.5 μm in the same manner as in Example 4 (FIG. 4B), and an oxide film 403 having a thickness of 0.5 μm was formed on the surface of the epitaxial layer 402 (FIG. 4C). By the oxidation, the thickness of the epitaxial layer 402 was reduced to about 0.25 μm.

Then, a BPSG film 407 was deposited on the thus formed oxide film 403 in the same manner as in Example 4 (FIG. 4D), and the flattening of the surface of the BPSG film 407 was carried out in the same manner as in Example 4 to prepare a first substrate.

Figure 4E:
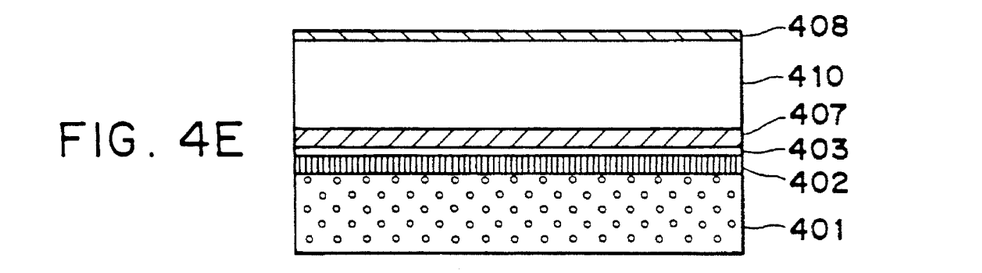

The first substrate and another fused quartz substrate 410, 4 inches in diameter, were washed and bonded to each other at the mirror surfaces, and the bonded substrates were heat treated at 500° C. for 30 minutes. After the heat treatment, a silicon nitride film 408 was deposited on the outer surface of the quartz substrate 410 to a thickness of 0.3 μm by plasma CVD as a protective film for the successive selective etching step. The nitride film 408 had a silicon-rich composition, compared with the ordinary composition, i.e. Si:N= 3.7:4, to increase the resistance to etching by hydrofluoric acid (FIG. 4E).

Figure 4F:
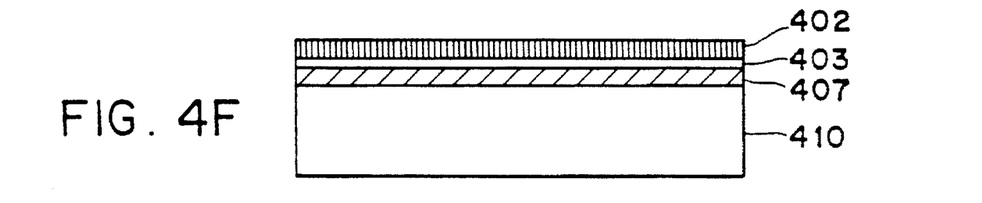

Then, the porous silicon portion 401 was selectively etched away in the same etching procedure as in Example 4. The silicon nitride film 408 as the protective film disappeared almost at the same time when the porous silicon substrate 401 was entirely etched away, while the quartz substrate 410 was etched only to a depth of a few μm (FIG. 4F).

Finally, the entire substrate was heat treated at 1100° C., which was higher than the flow temperature of BPSG, for one hour to increase the bonding strength at the bonding interface.

Through the foregoing steps, an SOI substrate comprising the BPSG film 407, the silicon oxide film 403 and the epitaxial film 402 successively formed on the quartz substrate 410 was obtained.

EXAMPLE 6

The sixth example of the present invention will be explained in detail, referring to FIGS. 5A to 5F.

Figure 5A:
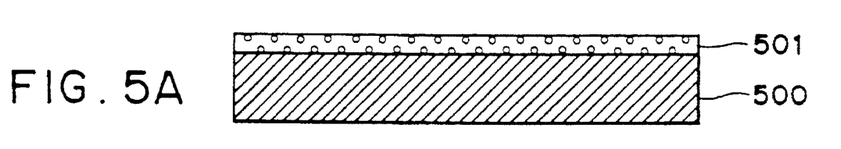

A p-type (100) silicon substrate 500 having a thickness of 400 μm and a resistivity of 0.01 Ω·cm was made to porous only to a depth of 20 μm from the surface to form a porous layer 501 (FIG. 5A).

Figure 5B:
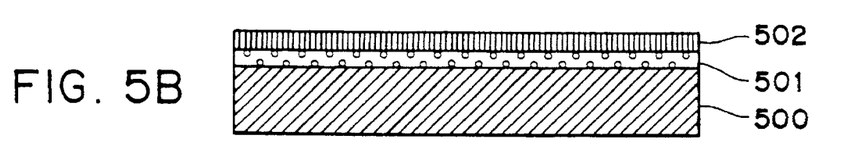

An epitaxial layer 502 was formed on the porous surface of the substrate to a thickness of 0.5 μm in the same manner as in Example 4 (FIG. 5B).

Figure 5C:
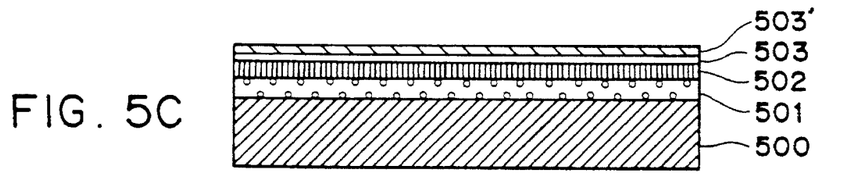
Figure 5D:
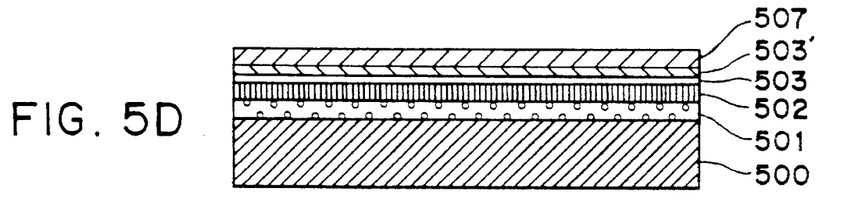

An oxide film 503 was formed on the surface of the epitaxial layer 502 to a thickness of 0.5 μm (FIG. 5C). By the oxidation, the thickness of the epitaxial layer 502 was reduced to about 0.25 μm. Then, a silicon nitride film 503' was deposited on the surface of the oxide film 502 to a thickness of 0.2 μm by LPCVD. A BPSG film 507 was deposited on the surface of the silicon nitride film 503' to a thickness of 0.5 μm by plasma CVD (FIG. 5D). Fine unevenness on the BPSG surface was flattened by the same flow procedure as in Example 4, whereby a first substrate was obtained.

Figure 5E:
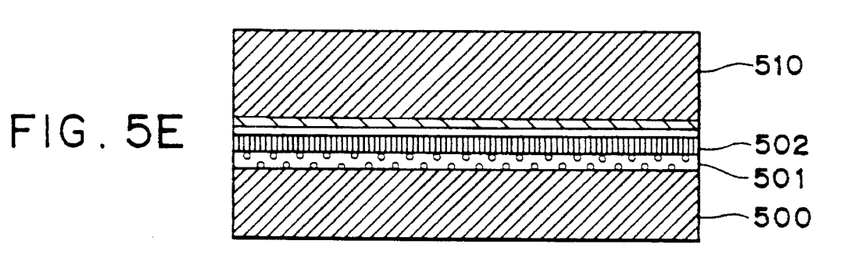

The first substrate and another silicon substrate 510, 4 inches in diameter, as a second substrate, were washed and then bonded to each other at the mirror surfaces, and the bonded substrates were heat treated at 1100° C. for 2 hours (FIG. 5E).

Figure 5F:
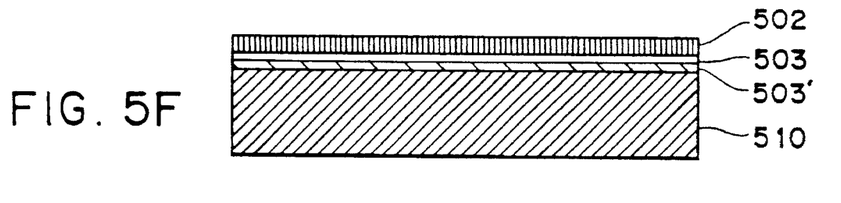

The monocrystalline silicon substrate portion 500 of the first substrate was entirely ground by mechanical grinding to expose the porous portion 501, and then the porous silicon portion 501 was selectively etched in the same manner as in Example 4. The thickness of the porous silicon portion to be etched 501 was only about 20 μm, and thus the porous silicon portion 501 was entirely etched away within about 10 minutes, whereby an SOI substrate comprising the BPSG film 507, the silicon nitride film 503' the silicon oxide film 503 and the epitaxial layer 502 successively formed on the silicon substrate 510 was obtained (FIG. 5F).

EXAMPLE 7

The seventh example of the present invention will be explained in detail, referring to FIGS. 6A to 6F.

Figure 6A:
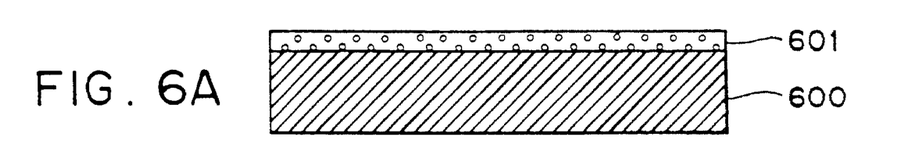

A p-type (100) silicon substrate 600 having a thickness of 400 μm and a resistivity of 0.01 Ω·cm was made porous only to a depth 20 μm from the surface to form a porous layer 601 (FIG. 6A).

Figure 6B:
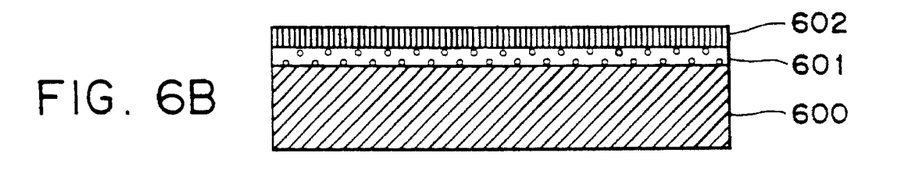
Figure 6C:
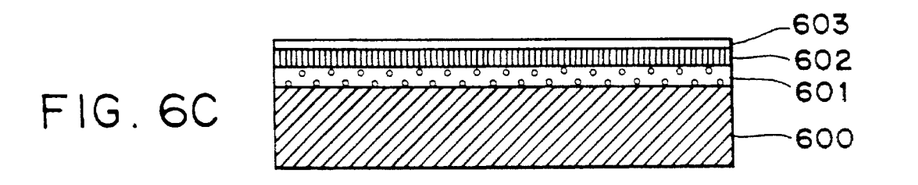
Figure 6D:
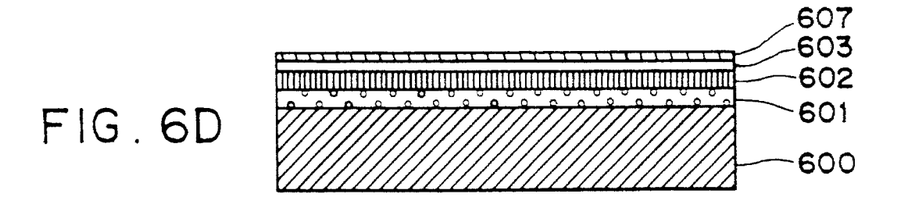

An epitaxial layer 602 was formed on the porous surface of the substrate to a thickness of 0.5 μm in the same manner as in Example 4 (FIG. 6B). Then the surface of the epitaxial layer 602 was oxidized in steam at 1000° C. to form an oxide film 603 having a thickness of 0.5 μm. Consequently, the thickness of the silicon monocrystalline portion 602 of the epitaxial layer was reduced to 0.25 μm (FIG. 6C).

Then, a BPSG film 607 was deposited on the surface of the oxide film 603 to a thickness of 0.2 μm by plasma CVD, and flattening by surface flow by heat treatment was carried out (FIG. 6D) to obtain a first substrate.

Figure 6E:
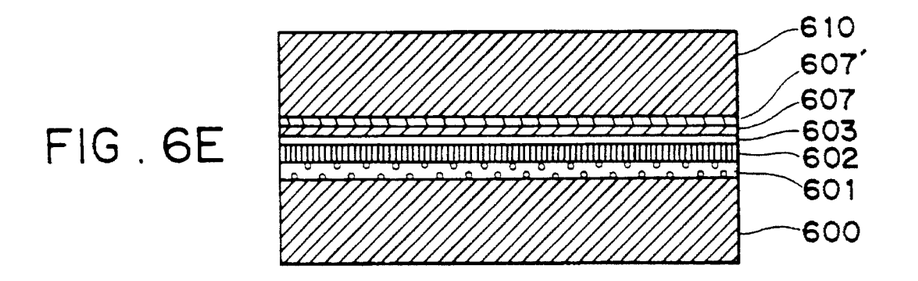

Another silicon substrate 610, 4 inches in diameter, as a second substrate was provided with a BPSG film 607' on the surface of substrate 610 to a thickness of 0.2 μm by plasma CVD, and the surface of the BPSG film 607' was flattened also by the surface flow. Then, the first substrate and the second substrate were bonded to each other at the BPSG surfaces, and then the bonded substrates were heat treated at 1100° C. for 2 hours (FIG. 6E).

Figure 6F:
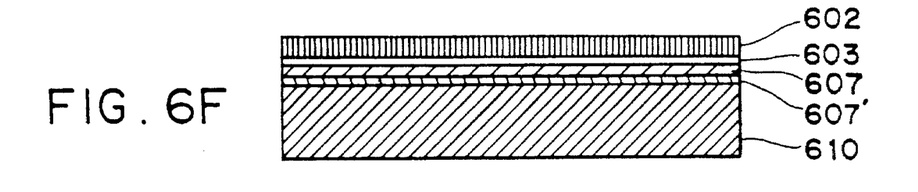

The entire monocrystalline silicon substrate portion 600 of the first substrate was ground by mechanical grinding to expose the porous portion 601. Then, the porous silicon portion 601 was selectively etched in the same etching procedure as in Example 4. The thickness of the porous silicon portion 601 to be etched was only about 20 μm, and thus the entire porous silicon portion 601 was etched away within about 10 minutes, whereby an SOI substrate comprising the BPSG films 607 and 607', the silicon oxide film 603 and the epitaxial layer 602 successively formed on the silicon substrate 610 was obtained (FIG. 6F).

As described in detail above, bonded substrates with a good bonding interface without voids can be obtained by providing a viscous flow-promoting intermediate layer in the region near the interface according to the present invention, and can be used in various applications.

According to the present process for preparing a bonded SOI substrate which comprises the steps of successively forming a monocrystalline epitaxial growth layer, an oxidized layer thereof, and a heat softening insulating layer on porous silicon to prepare a first substrate bonding the first substrate to a second substrate, heat treating the bonded substrates and selectively removing the porous silicon, since generation of voids (unbonded parts) due to fine surface unevenness can be prevented and stresses on the substrates generated at the bonding interface by heat treatment can be released, an SOI substrate free from warping can be provided.

What is claimed is:

1. A process for preparing a semiconductor substrate comprising:

providing a first substrate having a semiconductor layer and an insulating layer;

forming a first layer comprising an element constituting said insulating layer and at least one of boron and phosphorus on the surface of said insulating layer;

contacting the first layer with a second substrate; and integrating both of the substrates by a heat treatment to form the semiconductor substrate, wherein the boron and/or the phosphorus are provided on the surface of the insulating layer by ion implantation.

2. A process for preparing a semiconductor substrate which comprises bringing a first substrate and a second substrate each provided with at least one of boron and phosphorus on the surface of an insulating layer on the surface of the substrate in contact with each other so that the insulating layers are in contact with each other, and integrating both of the substrates by a heat treatment, wherein the boron and/or the phosphorus are provided on the surface of the insulating layer by ion implantation.

3. A process according to claims 1 or 2, wherein the first substrate and the second substrate are single element semiconductors, compound semiconductors or one of the first and second substrates is glass.

4. A process according to claim 1, wherein the thickness of said first layer is in a range of from 0.1 to 1.0 μm.

5. A process according to claim 1 or 2, wherein the boron and/or the phosphorus are ion implanted in an amount ranging from $1 \times 10^{20}$ to $5 \times 10^{21}$ cm$^{-3}$.

* * * * *

UNITED STATES PATENT AND TRADEMARK OFFICE
CERTIFICATE OF CORRECTION

PATENT NO. : 5,453,394
DATED : September 26, 1995
INVENTOR(S) : TAKAO YONEHARA ET AL.   Page 1 of 3

It is certified that error appears in the above-identified patent and that said Letters Patent is hereby corrected as shown below:

On Title page;
AT [56] REFERENCES CITED

Foreign Patent Documents,

"1189145  7/1989 Japan
 3173422  7/1991 Japan
 472608   3/1992 Japan" should read
--1-189145  7/1989 Japan
  3-173422  7/1991 Japan
  4-72608   3/1992 Japan--.

COLUMN 3

Line 23 "other" should read --another--.
Line 54 "Phoenis," should read --Phoenix,--

COLUMN 4

Line 48 "According" should read --¶ According--.

COLUMN 5

Line 34 "researches" should read --research--.
Line 51 "is" should read --are--.
Line 65 "Preferable" should read --preferable--.

COLUMN 6

Line 11 "$1 \times 10^{20}$cm" should read --$1 \times 10^{20}$cm$^{-3}$--.
Line 51 "characteristics." should read
--characteristic.--.

UNITED STATES PATENT AND TRADEMARK OFFICE
CERTIFICATE OF CORRECTION

PATENT NO. : 5,453,394

DATED : September 26, 1995

INVENTOR(S) : TAKEO YONEHARA ET AL.      Page 2 of 3

It is certified that error appears in the above-identified patent and that said Letters Patent is hereby corrected as shown below:

COLUMN 7

Line 32 "can" should read --can be--.
    Line 39 "bonded" should read --bonded to--.
    Line 43 "made" should read --made to--.

COLUMN 8

Line 19 "unprefeventially" should read --unpreferentially--.
    Line 62 "an" should read --a--.

COLUMN 9

Line 24 "In" should read --¶ In--.

COLUM 10

Line 12 "successived" should read --successively--.
    Line 26 "oxide" should read --oxidized--.
    Line 57 "thermally" should read --thermal--.
    Line 59 "oxided" should read --oxidized--.

COLUMN 11

Line 48 "as" should read --an--.

COLUMN 13

Line 5 "to" should be deleted.

UNITED STATES PATENT AND TRADEMARK OFFICE
CERTIFICATE OF CORRECTION

PATENT NO.   : 5,453,394
DATED        : September 26, 1995
INVENTOR(S)  : TAKAO YONEHARA ET AL.          Page 3 of 3

It is certified that error appears in the above-identified patent and that said Letters Patent is hereby corrected as shown below:

<u>COLUMN 14</u>

Line 54 "claims" should read --claim--.

Signed and Sealed this

Fourteenth Day of May, 1996

Attest:

BRUCE LEHMAN

Attesting Officer      Commissioner of Patents and Trademarks